(12) United States Patent
Takahashi et al.

(10) Patent No.: US 6,750,728 B2
(45) Date of Patent: Jun. 15, 2004

(54) QUARTZ OSCILLATOR AND METHOD FOR MANUFACTURING THE SAME

(75) Inventors: Naoyuki Takahashi, Hamamatsu (JP); Takato Nakamura, Hamamatsu (JP); Satoshi Nonaka, Hamamatsu (JP); Hiromi Yagi, Hamamatsu (JP); Yoichi Shinriki, Tachikawa (JP); Katsumi Tamanuki, Kanagawa-ken (JP)

(73) Assignee: Humo Laboratory, Ltd., Tokyo (JP)

( * ) Notice: Subject to any disclaimer, the term of this patent is extended or adjusted under 35 U.S.C. 154(b) by 10 days.

(21) Appl. No.: 10/197,805

(22) Filed: Jul. 19, 2002

(65) Prior Publication Data

US 2003/0184397 A1 Oct. 2, 2003

(30) Foreign Application Priority Data

Mar. 28, 2002 (JP) .......................................... 2002-91372

(51) Int. Cl.⁷ ................................................. H03B 5/30
(52) U.S. Cl. ........................................ 331/156; 331/154
(58) Field of Search ................................. 331/154, 156, 331/158, 164

(56) References Cited

U.S. PATENT DOCUMENTS 3,609,593 A * 9/1971 Boll et al. ................... 331/156
6,245,147 B1 * 6/2001 Kobayashi ................... 118/500

* cited by examiner

Primary Examiner—Kenneth B. Wells
(74) Attorney, Agent, or Firm—Venable LLP; Michael A. Sartori; Chad C. Anderson

(57) ABSTRACT

A quartz oscillator includes a base, a quartz thin-film formed on the base by epitaxial growth, a vibrating reed portion formed by processing the quartz thin-film, and excitation electrodes for vibrating the vibrating reed portion. At least one of the excitation electrodes may be formed by depositing a metal. The material for the base may include a single-element semiconductor, a compound semiconductor, and an oxide. When a semiconductor is used for the base, a semiconductor circuit may be provided to the base to form a module including a quartz oscillator.

11 Claims, 6 Drawing Sheets

A—A

A−A

A—A

A—A

QUARTZ OSCILLATOR AND METHOD FOR MANUFACTURING THE SAME

BACKGROUND OF THE INVENTION

1. Field of the Invention

The present invention relates to quartz oscillators used for oscillating devices including a quartz thin-film vibrator, and particularly relates to a quartz oscillator including a quartz filter and to a method for manufacturing the quartz oscillator.

2. Description of the Related Art

A quartz oscillator is generally referred to as one having a quartz blank designed on the basis of the required performance, thin-film electrodes provided on the surfaces of the quartz blank, and a retainer including a thin supporting plate functioning as both mechanical support and an electrical lead, wherein the quartz blank and the thin-film electrodes are stored in the retainer in a sealed manner. On the other hand, a quartz filter is a device having a function of extracting required frequency components from various signal components and attenuating undesired frequency components. Among such filters, an MCF (Monolithic Crystal Filter), which includes two electrodes provided on a crystalline wafer and which has filter characteristics based on a combination of two vibration modes, is widely known. Since the present invention generally relates to quartz oscillators, structures thereof, and manufacturing methods thereof, the term quartz oscillator includes quartz filters and is used in a broad sense herein.

Quartz oscillators are used as important devices essential to information communication because of their high stability. Recently, with the development of communication satellites and mobile phones, high performance and miniaturization have been strongly required.

Depending on the above requirements, various methods have been proposed. A method for manufacturing a monocrystalline quartz thin-film by a sol-gel process is disclosed in Japanese Unexamined Patent Application Publication No. 8-157297, and a method for processing a quartz blank is disclosed in Japanese Unexamined Patent Application Publication No. 5-327383. In Japanese Patent Application No. 2000-270300, the inventors have proposed an atmospheric pressure vapor phase epitaxy (AP-VPE) method in which epitaxial growth is performed on a base by the reaction of silicon alkoxide with oxygen in atmospheric pressure without using a vacuum apparatus.

Since the frequencies used in mobile communication systems have reached the GHz band, the quartz oscillators used therein should generate higher frequencies.

Since the oscillating frequency of a quartz oscillator is inversely proportional to the thickness of the quartz blank, the quartz blank should have a small thickness. However, it is difficult to achieve a quartz blank having a thickness of 40 $\mu$m or less by current processing methods. Thus, the oscillating frequency of mass-produced quartz oscillators has not exceeded about 40 MHz when using the fundamental wave.

In order to increase the frequency, it is necessary to employ a processing method such as wet etching or dry etching. However, when the etching rate is reduced to improve the control of the thickness, there is a problem in that it takes a long time to achieve a desired thickness because the large quantity of quartz chippings formed by etching needs to be removed.

In order to solve the above problem, the inventors have developed an atmospheric pressure vapor phase epitaxy (AP-VPE) method in which epitaxial growth is performed on a base by the reaction of silicon alkoxide with oxygen in atmospheric pressure without using a vacuum apparatus, and have made a patent application, filed as Japanese Patent Application No. 2000-270300.

SUMMARY OF THE INVENTION

Accordingly, it is an object of the present invention to provide a quartz oscillator including a base and a quartz thin-film formed on the base by the above-mentioned method and to provide a method for manufacturing the quartz oscillator.

In order to achieve the above object, according to the present invention, a quartz oscillator includes a base having a crystal face, a quartz thin-film formed on the face of the base by epitaxial growth under atmospheric pressure, a vibrating reed portion formed by processing the quartz thin-film, and excitation electrodes for exciting the vibrating reed portion.

In the quartz oscillator, the base is one selected from the group consisting of a single-element semiconductor, a compound semiconductor, and an oxide.

In the quartz oscillator, the single-element semiconductor is one of Si and Ge, the compound semiconductor is one selected from the group consisting of GaAs, GaP, GaN, ZnS, and ZnSe, and the oxide is one selected from the group consisting of $Al_2O_3$, ZnO, MgO.

The quartz oscillator further Includes a semiconductor circuit provided at an area of the base where the vibrating reed portion is not situated, wherein the base is a semiconductor crystal.

In order to achieve the above object, according to the present invention, a method for manufacturing a quartz oscillator includes the steps of preparing a crystalline wafer for a base, epitaxially growing a quartz thin-film on the base, forming a vibrating reed portion by processing the quartz thin-film and the base, and providing excitation electrodes for exciting the vibrating reed portion.

In order to achieve the above object, a method for manufacturing a quartz oscillator indudes the steps of preparing a crystalline wafer for a base, epitaxially growing a crystalline layer on the crystal of the base, epitaxially growing a quartz thin-film on the crystalline layer, forming a vibrating reed portion by processing the quartz thin-film, the crystalline layer and the base, and providing excitation electrodes for exciting the vibrating reed portion.

In the method for manufacturing a quartz oscillator, the crystalline wafer has a buffer layer disposed thereon and the vibrating reed portion is disposed on the buffer layer.

The method for manufacturing a quartz oscillator further includes the step of processing the base after epitaxially growing the quartz thin-film on the base, wherein a portion or all of the processed base has a thickness of several hundreds of microns.

The method for manufacturing a quartz oscillator further includes the step of partly removing the quartz thin-film or the base by machining or chemical-processing after forming the quartz thin-film by epitaxial growth.

In order to achieve the above object, a quartz oscillator includes a base having a recessed portion provided on one face thereof by processing to have a inverse mesa shape, a quartz thin-film formed on the other face of the base by epitaxial growth to have a thickness of 10 $\mu$m or less, a vibrating reed portion, and excitation electrodes for mechanically supporting the quartz thin-film and for vibrating the vibrating reed portion.

As described above, according to the present invention, the quartz thin-film is directly formed on the base comprising a single-element semiconductor such as Ge and Si, a compound semiconductor, or an oxide by epitaxial growth. Thus, the quartz thin-film can be processed precisely and can be made extremely thin, so that quartz oscillators having a resonant frequency of at least 100 MHz and including a quartz thin-film with a thickness of 20 $\mu$m or less can be readily manufactured, which has not been achieved conventionally.

Furthermore, the quartz thin-film has an extremely small thickness and is easy to handle.

In a method for manufacturing a quartz oscillator according to the present invention, ft is not necessary to remove quartz chippings during the etching step, whereas their removal has been required in conventional methods. Thus, the manufacturing cost can be reduced.

According to the present invention, a semiconductor circuit, which is used as an oscillating circuit, can be provided on the base of a quartz oscillator, that is, a quartz oscillator including an oscillating circuit In an integrated manner can be provided. When the quartz oscillator is used in a quartz filter, an integrated filter that has a preamplifier or a buffer amplifier can be provided in an integrated manner. Such an integrated filter has filter characteristics, which are resistant to being disturbed by external circuits. Furthermore, impedance matching in the integrated filter is easy.

DESCRIPTION OF THE PREFERRED EMBODIMENTS

A quartz oscillator and a method for manufacturing the same will now be described with reference to the accompanying drawings.

EXAMPLE 1
(First Method for Forming Quartz Thin-film)

Epitaxial quartz thin-films each having a thickness of 1–300 $\mu$m were formed under the following conditions by an atmospheric pressure vapor phase epitaxy (AP-VPE) method, which has been developed by the inventors and is disclosed in Japanese Patent Application No. 200 0-270300. One of the epitaxial quartz thin-films, having a thickness of 96 $\mu$m, was used in the following measurement.

Typical reaction conditions are shown in Table 1, wherein "sccm" represents "standard cubic centimeter per minute".

TABLE 1

| | |
|---|---|
| Partial Pressure of Tetraethoxysilane | $3.3 \times 10^{-3}$ atm |
| Partial Pressure of $O_2$ | $3.3 \times 10^{-1}$ atm |
| Partial Pressure of HCl | $1.67 \times 10^{-3}$ atm |
| Total pressure | 1 atm |
| Total Flow rate | 800 sccm |
| Base | Si (111) |
| Growth Temperature | 550–850° C. |

Figure 10:
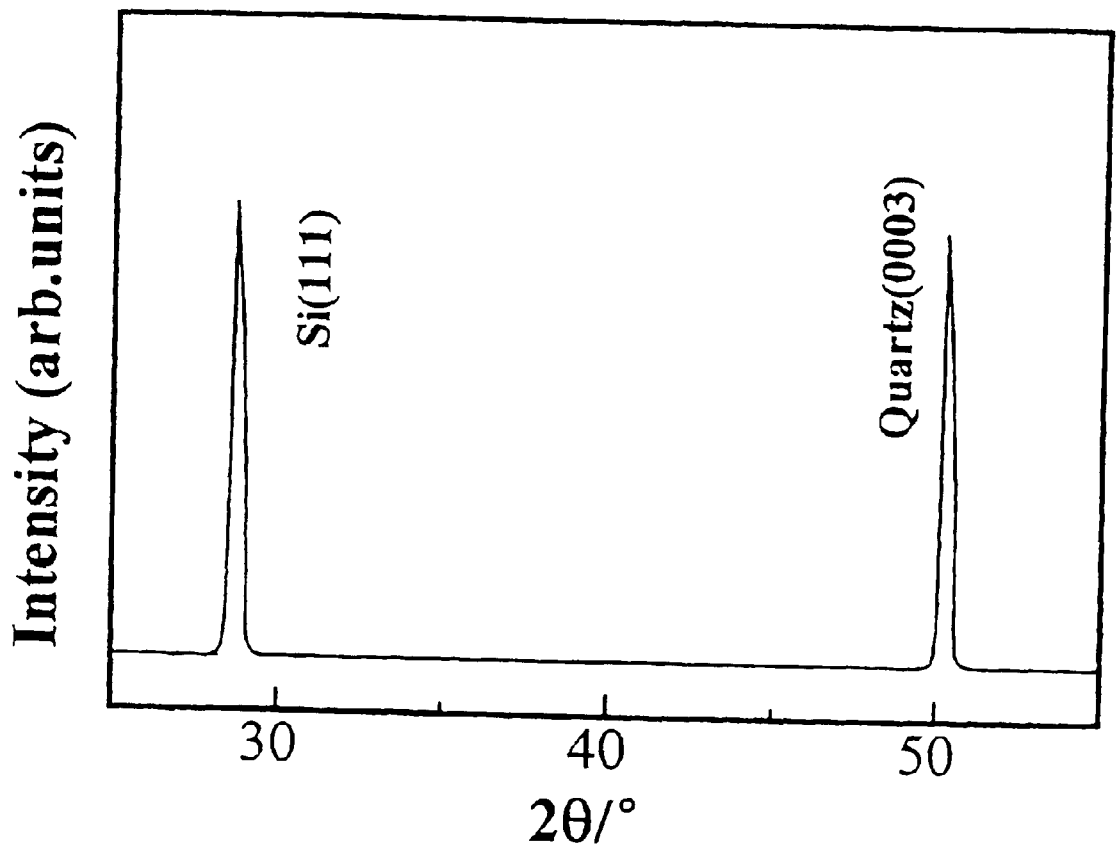
FIG. 10 is a two crystal X-ray diffraction spectrum of an epitaxially grown crystalline layer which has been formed on a base used in the above-mentioned methods.

The resulting epitaxial quartz thin-films will now be described. FIG. 10 shows the X-ray diffraction (XRD) pattern of one of the epitaxial quartz thin-films formed at 800° C. The thin-film has a thickness of 96 $\mu$m.

The conditions of the measurement, performed by using a RIGAKU RINT 2000, are shown in Table 2.

TABLE 2

| | |
|---|---|
| X Ray | Cuk $\alpha_1$, 30 kV, 20 mA |
| Scanning Axis | 2θ/θ |
| Light Receiving Slit | 0.3 mm |
| Scanning Range | 35–55° |
| Scanning Rate | 1°/min. |

The X-ray diffraction pattern shown in FIG. 10 shows peaks at 50.6° (2θ) and 28.44° (2θ). The peak at 50.6° (2θ) is assigned to a (003) plane of a hexagonal crystal, which means that the epitaxial quartz thin-film has a hexagonal crystalline structure. The peak at 28.44° (2θ) is assigned to a (111) plane of a Si substrate.

EXAMPLE 2
(First Method for Manufacturing Oscillator)

In order to manufacture a quartz oscillator, a vibrating reed portion 2 was formed by processing the quartz thin-film 1 provided directly on a base comprising a Si (111) substrate, as described above, using semiconductor-processing techniques.

Figure 1:
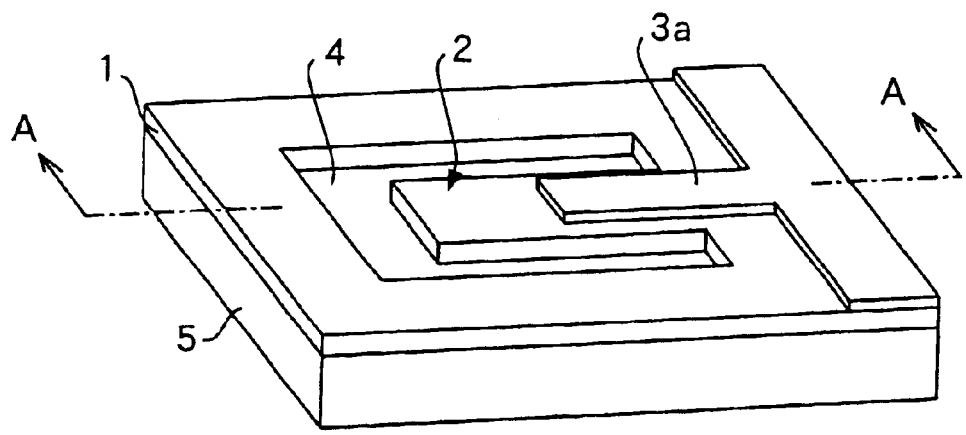
FIG. 1 is a perspective view of a quartz oscillator manufactured by a first method according to the present invention.
Figure 2:
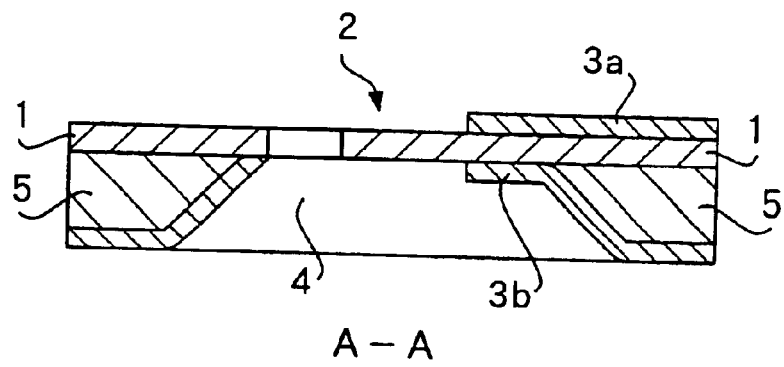
FIG. 2 is a sectional view of the quartz oscillator shown in FIG. 1.

FIG. 1 is a perspective view illustrating a quartz oscillator, according to a first manufacturing method thereof, having the vibrating reed portion 2 disposed on the base 5, and FIG. 2 is a sectional view illustrating the quartz oscillator. The quartz thin-film 1 is disposed on the base 5 comprising the Si (111) substrate. An upper excitation electrode 3a is disposed on the upper face of the vibrating reed portion 2, and a lower excitation electrode 3b extends from the lower face of the vibrating reed portion 2 to the lower face of the base 5, wherein the upper and lower excitation electrodes 3a and 3b are formed by the deposition of Au or Ag.

Referring to FIG. 2, the vibrating reed portion 2 projects over a recessed portion 4 having an angular shape from the right side, wherein the vibrating reed portion 2 has been formed by processing the quartz thin-film 1 and the recessed portion 4 has been provided at the center of the base 5 by processing the base 5. The vibrating reed portion 2, which is rectangular, has a width of 0.8 mm and a length of 5 mm.

The upper and lower excitation electrodes 3a and 3b each have an effective portion with a width of 0.5 mm and a length of 2 mm. The base 5 has a groove in the lower face thereof and the lower excitation electrode 3b extends through the groove of the base 5 to the lower face of the vibrating reed portion 2.

In this example, the quartz thin-film 1 having a thickness of 96 μm has been processed by dry etching to form the vibrating reed portion.

In this example, the quartz oscillator was manufactured according to the following steps.
(1) Preparing A Crystalline Substrate for a Base
 The Si (111) substrate for the base 5 was provided.
(2) Forming a Quartz Thin-film
 The quartz thin-film 1 was epitaxially grown on the base 5 comprising the Si (111) substrate.
(3) Forming a Vibrating Reed Portion
 The quartz thin-film 1 and the base 5 were etched to form a vibrating reed portion 2 having the above-mentioned shape.
(4) Forming Excitation Electrodes
 Au or Ag was deposited on both the upper and lower faces of the vibrating reed portion 2 to form excitation electrodes 3a and 3b.

Figure 11:
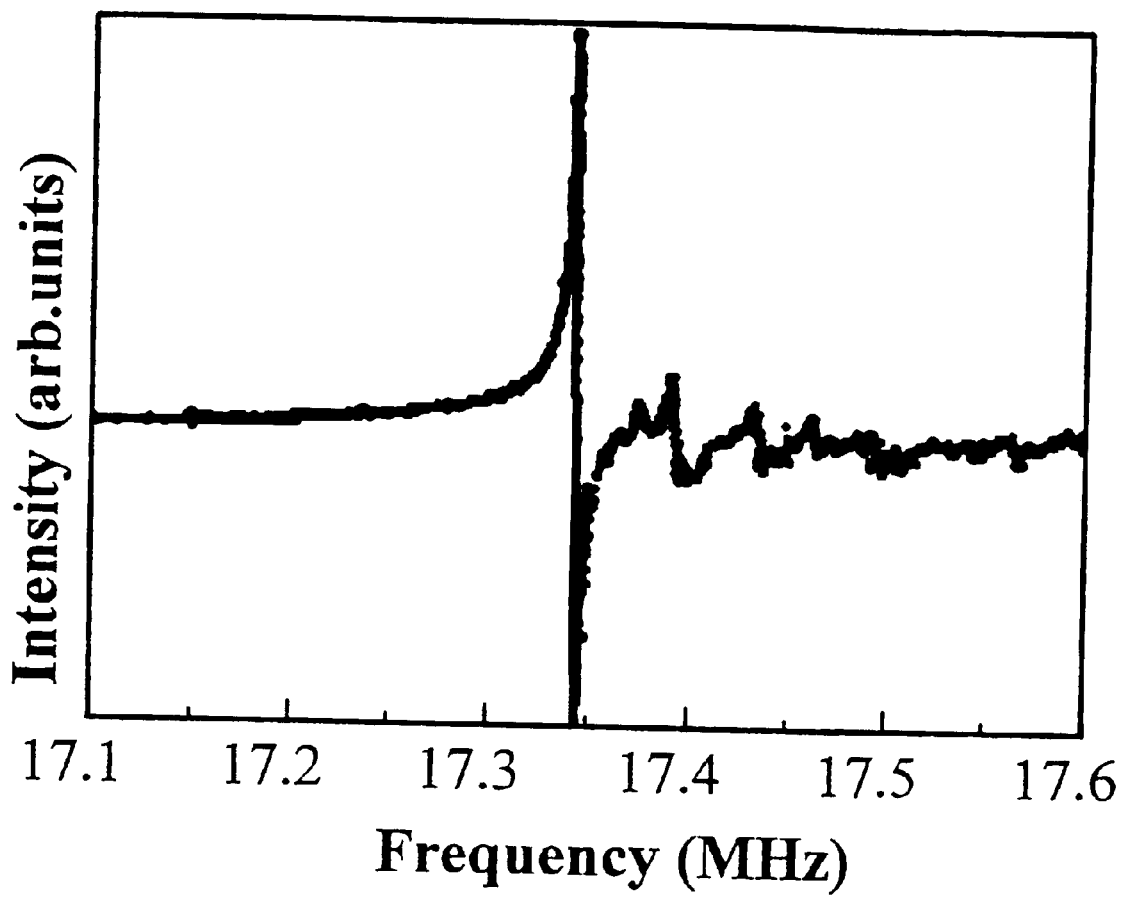
FIG. 11 is a graph showing the intensity of the oscillating frequency of a quartz oscillator according to the present invention.

FIG. 11 shows the relationship between the frequency and the oscillation intensity of the quartz oscillator manufactured by the above method. Strong Intensity appears at 17.34 MHz. This means that the quartz thin-film having an excellent characteristic has been formed by this method. Since the quartz thin-film can be formed directly on the base comprising the Si substrate and the thickness of the thin-film can be controlled, an etching step, which Is required in a conventional method for manufacturing quartz oscillators, is not necessary. Thus, the manufacturing time is significantly reduced.

Since quartz thin-films can be processed to have an optional shape or dimensions by using a semiconductor-processing technique such as photolithography or etching, this manufacturing method is advantageous in that the high performance, the miniaturization, and the mass production can be achieved.

EXAMPLE 3
(Second Method for Manufacturing Oscillator)

Another example, which is a variation of example 2, will now be described with reference to FIG. 3.

Figure 3:
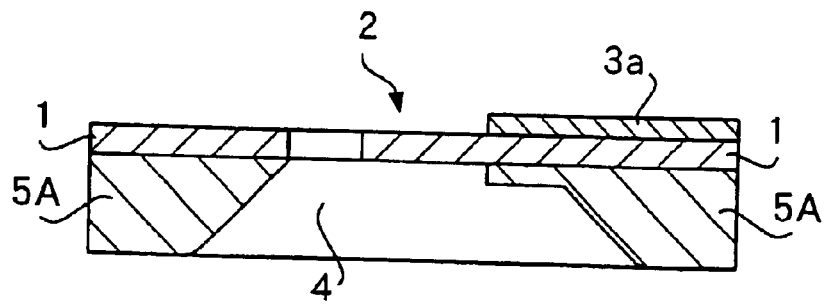
FIG. 3 is a sectional view of another quartz oscillator manufactured by a second method according to the present invention, which is a variation of the first method.
Figure 4:
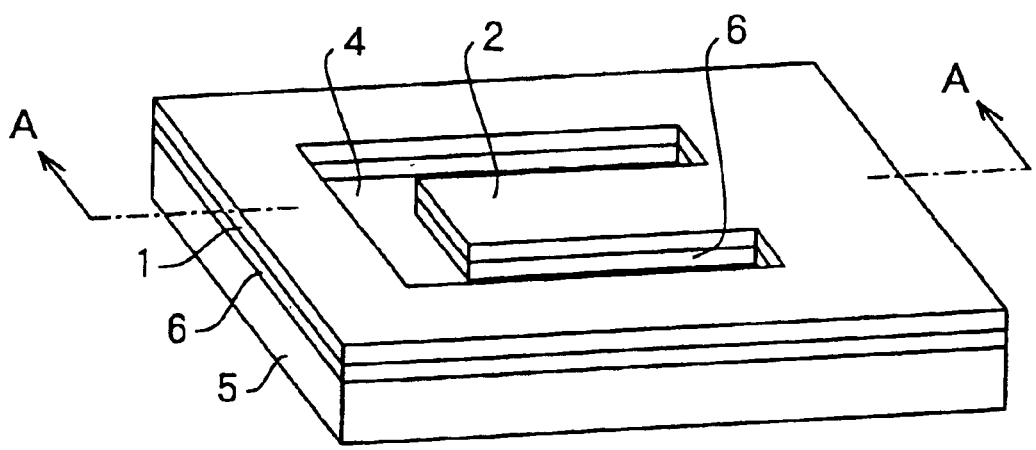
FIG. 4 is a perspective view of a quartz oscillator, having no electrodes, manufactured by a third method according to the present invention.

FIG. 3 shows another quartz oscillator including a base 5A that has been highly doped to function as an electrode.

In this example, the quartz oscillator was manufactured according to the following steps.
(1) Preparing a Crystalline Substrate for a Base
 A highly doped Si (111) substrate for a base 5A was provided.
(2) Forming a Quartz Thin-film
 A quartz thin-film 1 was epitaxially grown on the base 5A comprising the Si (111) substrate. The method was the same as that of EXAMPLE 2.
(3) Forming a Vibrating Reed Portion
 The quartz thin-film 1 and the base 5A were etched to form a vibrating reed portion 2 having the above-mentioned shape.
(4) Forming Excitation Electrodes
 Au or Ag was deposited on only the upper face of the vibrating reed portion 2 to form an upper excitation electrode 3a. A portion of the base 5A was caused to remain in step (3) so as to function as another electrode on the lower face of the vibrating reed portion 2.

FIG. 3 shows the upper excitation electrode 3a and the portion of the base 5A, positioned under the vibrating reed portion 2, functioning as a lower excitation electrode 3b.

EXAMPLE 4
(Third Method for Manufacturing Oscillator)

Figure 5:
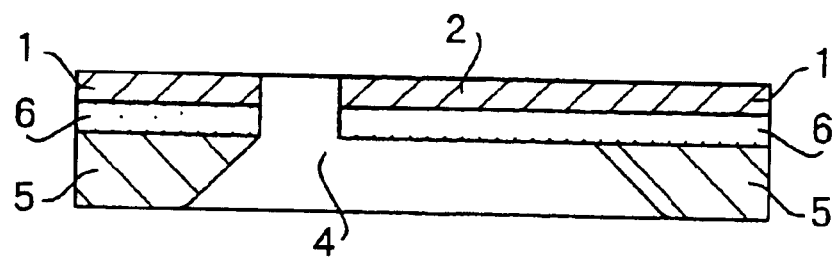
FIG. 5 is a sectional view of the quartz oscillator shown in FIG. 4.
Figure 6:
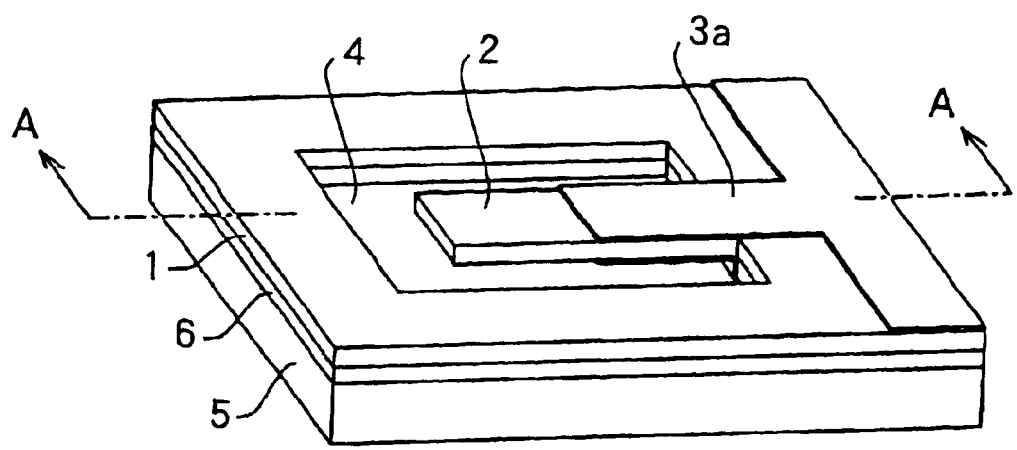
FIG. 6 is a perspective view of a quartz oscillator, having electrodes, manufactured by the third method according to the present invention.
Figure 7:
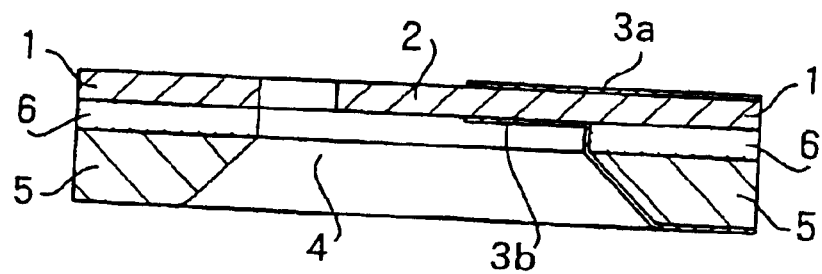
FIG. 7 is a sectional view of the quartz oscillator shown in FIG. 6.

In this example, a crystalline layer different from a base was epitaxially grown on the base 5 and a quartz thin-film 1 was then epitaxially grown on the crystalline layer. The crystalline layer included GaAs and ZnO. The quartz oscillator was manufactured according to the following steps.
(1) Preparing a Crystalline Substrate for a Base
 A Si (111) substrate for the base 5 was provided.
(2) Forming a Crystalline Layer Different from the Base
 A GaAs layer 6, which was a crystalline layer different from the base, was epitaxially grown on the base 5 to have a thickness of several ten microns.
(3) Forming a Quartz Thin-film
 The quartz thin-film 1 was epitaxially grown on the GaAs layer 6.
(4) Forming a Vibrating Reed Portion
 A vibrating reed portion 2, which was the same as the one described in example 2 with reference to FIGS. 1 and 2, was formed according to the following procedure, as shown in FIGS. 4 to 7. The base 5, the GaAs layer 6, and the quartz thin-film 1 were etched with hydrofluoric acid as an etchant to form a recessed portion 4 having the shape shown in FIGS. 4 and 5. At this stage, the GaAs layer 6 was made to remain under the lower surface of the vibrating reed portion 2, as shown in FIG. 5. A portion of the GaAs layer 6 under the lower surface of the vibrating reed portion 2 was then etched to have the shape shown in FIGS. 6 and 7, using an etchant that was any one of sulfuric acid, nitric acid, hydrochloric acid, and hydrogen peroxide, which etch the GaAs layer 6 and do not etch the base 5 and the quartz thin-film 1. This etching process is easier than that of EXAMPLE 2.
(5) Forming Excitation Electrodes
 Au or Ag was deposited on both the upper and lower faces of the vibrating reed portion 2 to form excitation electrodes 3a and 3b.

EXAMPLE 5
(Fourth Method for Manufacturing Oscillator)

This example is a variation of examples 2 and 3 and provides a method for manufacturing an oscillator having an extremely small thickness, for example, a thickness of 10 μm or less. A base 5B used in this example is highly doped, as in example 3, to have a high conductivity, that is, to function as an electrode.

Figure 8:
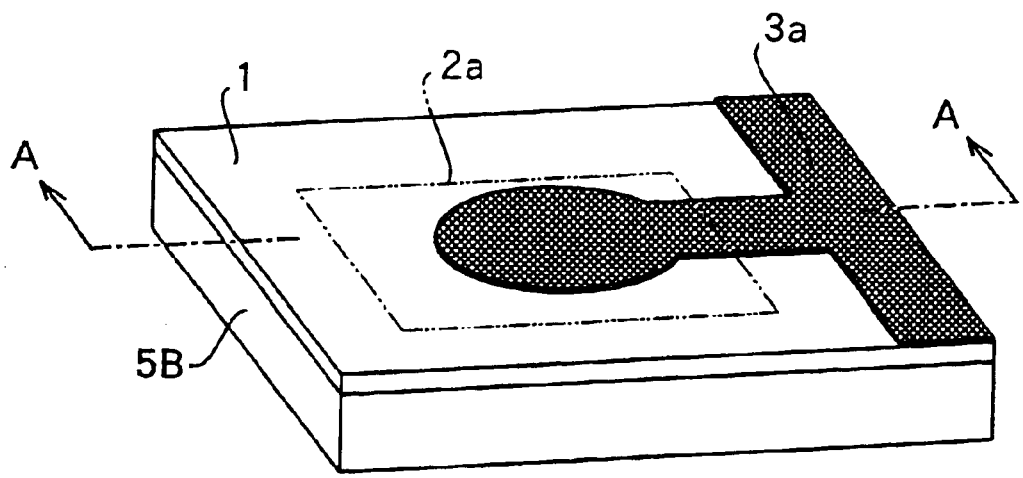
FIG. 8 is a perspective view of another quartz oscillator manufactured by a fourth method according to the present invention.
Figure 9:
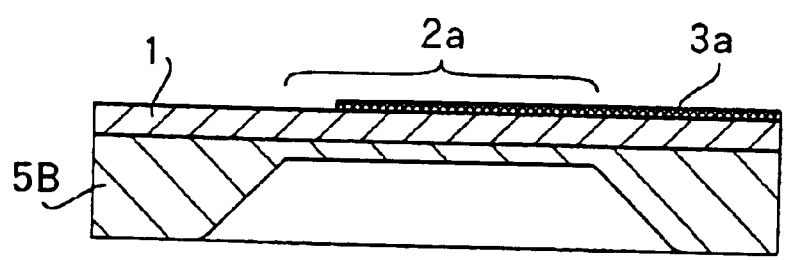
FIG. 9 is a sectional view of the quartz oscillator shown in FIG. 8.

An oscillator shown in FIGS. 8 and 9 was manufactured according to the following steps.
(1) Preparing a Crystalline Substrate for a Base
 A Si (111) substrate for a highly doped base 5B was provided.
(2) Step of Processing the Base
 The base 5B was processed to form a recessed portion having an inverse mesa shape at a face thereof. The part of the base 5B having the inverse mesa-shaped recessed portion had a thickness which was sufficient to allow an oscillating portion of a quartz thin-film 1 to be formed in the following step to oscillate and which was sufficient to mechanically support the quartz thin-film 1.
(3) Forming a Quartz Thin-film
 The quartz thin-film 1 was epitaxially grown on the base 5. The method was the same as those of the above examples.
(4) Forming a Vibrating Reed Portion
 The area of the quartz thin-film 1 on the part of the base 5B having the inverse mesa-shaped recessed portion was processed to function as a vibrating reed portion (vibrating thin-film) 2a.

(5) Forming Excitation Electrodes

Au or Ag was deposited on the upper face of the vibrating reed portion 2a to form an excitation electrode 3a. The other excitation electrode was a portion of the base 5B made to remain in the above steps.

FIGS. 8 and 9 show the upper excitation electrode 3a and the portion of the base 5B, positioned under the vibrating reed portion 2a, functioning as a lower excitation electrode 3b.

EXAMPLE 6
(Method for Manufacturing Quartz Thin-film)

In this example, a buffer layer was formed on a base comprising a Si (111) substrate by depositing quartz at 550° C. and then annealing the deposited quartz. A quartz thin-film was then formed on the buffer layer by an epitaxial growth method. The resulting structure including the base, the buffer layer (25 nm), and the quartz thin-film (96 μm), layered in that order, was processed to form an oscillator having the same shape as that of the oscillator of EXAMPLE 2. The characteristics were measured.

As a result of measuring the relationship between the frequency and the oscillating intensity, an oscillating intensity stronger than that of the oscillator of EXAMPLE 2 appeared at a frequency of 17.34 MHz.

Accordingly, it is clear that the buffer layer improves the crystallinity of the quartz thin-film to increase the oscillating intensity. Changing the thickness of the buffer layer provides various effects.

EXAMPLE 7
(Variation of Base Material)

Bases each comprising a single-element semiconductor such as Ge, a compound semiconductor such as GaAs, GaP, GaN, ZnS, and ZnSe, or an oxide such as ZnO and MgO were used for evaluation. A quartz thin-film was directly formed on each of the bases by an epitaxial growth method to prepare an oscillator. As a result of examining the oscillator, the same effects as those of the oscillators of above examples were obtained.

According to the present invention, a quartz thin-film can be grown on a base comprising a compound semiconductor to form a compound semiconductor circuit thereon. Thus, when using the circuit as an oscillating circuit, a quartz oscillator including the oscillating circuit can readily be manufactured in an integrated manner. Furthermore, when using the quartz thin-film for a quartz filter, filter preamplifiers or buffer amplifiers can be manufactured in an integrated manner.

What is claimed is:

1. A quartz oscillator comprising:
    a base having a crystal face;
    a quartz thin-film formed on the face of the base by epitaxial growth under atmospheric pressure;
    a vibrating reed portion formed by processing the quartz thin-film; and
    excitation electrodes for exciting the vibrating reed portion.

2. The quartz oscillator according to claim 1, wherein the base is one selected from the group consisting of a single-element semiconductor, a compound semiconductor, and an oxide.

3. The quartz oscillator according to claim 2, wherein the single-element semiconductor is one of Si and Ge, the compound semiconductor is one selected from the group consisting of GaAs, GaP, GaN, ZnS, and ZnSe, and the oxide is one selected from the group consisting of $Al_2O_3$, ZnO, MgO.

4. The quartz oscillator according to claim 1, further comprising:
    a semiconductor circuit provided at an area of the base where the vibrating reed portion is not situated,
    wherein the base is a semiconductor crystal.

5. A method for manufacturing a quartz oscillator comprising the steps of:
    preparing a crystalline wafer for a base;
    epitaxially growing a quartz thin-film on the base;
    forming a vibrating reed portion by processing the quartz thin-film and the base; and
    providing excitation electrodes for exciting the vibrating reed portion.

6. The method for manufacturing a quartz oscillator according to claim 5, wherein the crystalline wafer has a buffer layer disposed thereon and the vibrating reed portion is disposed on the buffer layer.

7. The method for manufacturing a quartz oscillator according to claim 5, further comprising the step of processing the base after epitaxially growing the quartz thin-film on the base, wherein a portion or all of the processed base has a thickness of several hundreds of microns.

8. The method for manufacturing a quartz oscillator according to claim 5, further comprising the step of partly removing the quartz thin-film or the base by machining or chemical processing after forming the quartz thin-film by epitaxial growth.

9. The method for manufacturing a quartz oscillator according to claim 6, further comprising the step of processing the base after epitaxially growing the quartz thin-film on the base, wherein a portion or all of the processed base has a thickness of several hundreds of microns.

10. The method for manufacturing a quartz oscillator according to claim 6, further comprising the step of partly removing the quartz thin-film or the base by machining or chemical processing after forming the quartz thin-film by epitaxial growth.

11. The method for manufacturing a quartz oscillator according to claim 7, further comprising the step of partly removing the quartz thin-film or the base by machining or chemical processing after forming the quartz thin-film by epitaxial growth.

* * * * *